(12) United States Patent
Moest et al.

(10) Patent No.: US 11,237,490 B2
(45) Date of Patent: Feb. 1, 2022

(54) LITHOGRAPHIC APPARATUS AND DEVICE MANUFACTURING METHOD

(71) Applicants: ASML NETHERLANDS B.V., Veldhoven (NL); ASML HOLDING N.V., Veldhoven (NL)

(72) Inventors: Bearrach Moest, Eindhoven (NL); Lowell Lane Baker, Norwalk, CT (US); James Robert Downes, Eindhoven (NL); Wijnand Hoitinga, Valkenburg (NL); Hermen Folken Pen, Vught (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/084,596

(22) PCT Filed: Jan. 26, 2017

(86) PCT No.: PCT/EP2017/051586
§ 371 (c)(1),
(2) Date: Sep. 13, 2018

(87) PCT Pub. No.: WO2017/157552
PCT Pub. Date: Sep. 21, 2017

(65) Prior Publication Data
US 2019/0079420 A1 Mar. 14, 2019

Related U.S. Application Data

(60) Provisional application No. 62/310,516, filed on Mar. 18, 2016.

(51) Int. Cl.
*G03F 7/20* (2006.01)

(52) U.S. Cl.
CPC .......... *G03F 7/70875* (2013.01); *G03F 7/705* (2013.01); *G03F 7/70341* (2013.01); *G03F 7/70783* (2013.01)

(58) Field of Classification Search
CPC . G03F 7/20; G03F 7/0002; G03F 1/36; G03F 1/26; G03F 1/38; G03F 7/0037;
(Continued)

(56) References Cited

U.S. PATENT DOCUMENTS 5,581,324 A 12/1996 Miyai et al.
5,633,101 A 5/1997 Imai
(Continued)

FOREIGN PATENT DOCUMENTS

CN 1800986 7/2006
CN 103913953 7/2014
(Continued)

OTHER PUBLICATIONS

International Search Report and Written Opinion issued in corresponding PCT Patent Application No. PCT/EP2017/051586, dated May 16, 2017.
(Continued)

*Primary Examiner* — Mesfin T Asfaw
(74) *Attorney, Agent, or Firm* — Pillsbury Winthrop Shaw Pittman LLP

(57) ABSTRACT

An apparatus including an illumination system to condition a radiation beam, a support to support a patterning device, the patterning device capable of imparting the radiation beam with a pattern in its cross-section to form a patterned radiation beam, a substrate table constructed to hold a substrate, a projection system to project the patterned radiation beam onto a target portion of the substrate, and a control system configured to: receive pattern data characterizing a pattern distribution, receive radiation data characterizing the radiation beam, determine a dissipation distribution of the pattern based on the pattern data and the radiation data, determine deformation of the pattern by applying the dissipation distribution in a thermo-mechanical model of the
(Continued)

patterning device, and determine a control signal to control a component of the apparatus based on the deformation of the pattern.

17 Claims, 4 Drawing Sheets

(58) Field of Classification Search
CPC .......... G03F 1/22; G03F 1/54; G03F 7/70266; G03F 1/144; G03F 1/50; G03F 7/70558; G03F 7/70891; G03F 7/70875; G03F 7/70341; G03F 7/705; G03F 7/70783; G03F 7/70141; G03F 7/70258; G03F 7/70508; H01L 21/0332; H01L 21/027; H01L 27/1288; H01L 21/0274
See application file for complete search history.

(56) References Cited

U.S. PATENT DOCUMENTS

| | | |
|---|---|---|
| 2002/0012109 A1 | 1/2002 | Suzuki et al. |
| 2006/0132750 A1 | 6/2006 | Gui et al. |
| 2007/0291243 A1 | 12/2007 | Suzuki |
| 2012/0133914 A1 | 5/2012 | Prosyentsov et al. |
| 2014/0272717 A1 | 9/2014 | Cheng et al. |

FOREIGN PATENT DOCUMENTS

| | | |
|---|---|---|
| JP | H04-192317 | 7/1992 |
| JP | H06-349700 | 12/1994 |
| JP | H06-349703 | 12/1994 |
| JP | 2012079735 | 4/2012 |
| TW | 201516557 | 5/2015 |
| TW | 201608344 | 3/2016 |
| WO | 2007123189 | 11/2007 |
| WO | 2016015987 | 2/2016 |
| WO | 2017153085 | 9/2017 |

OTHER PUBLICATIONS

Zhang, Qiaolin, et al..: "Modeling of Mask Thermal Distortion and Its Dependency on Pattern Density", Proc. of SPIE, vol. 5853, Jun. 28, 2005, pp. 234-242.
Japanese Office Action issued in corresponding Japanese Patent Application No. 2016-536441, dated Jul. 17, 2019.
Chinese Office Action issued in corresponding Chinese Patent Application No. 2017800161128, dated Dec. 3, 2019.
Korean Office Action issued in corresponding Korean Patent Application No. 10-2020-7030453, dated Jan. 1, 2021.

DD
$$\begin{bmatrix} 10 & 0 & 0 & 0 & 0 & 0 & 0 & 90 & 90 & 90 & 90 & 90 & 90 & 0 & 0 & 0 & 0 & 0 \\ 0 & 0 & 25 & 0 & 50 & 50 & 0 & 90 & 90 & 90 & 90 & 90 & 90 & 0 & 75 & 0 & 75 & 0 \\ 10 & 0 & 0 & 0 & 0 & 0 & 0 & 90 & 90 & 90 & 90 & 90 & 90 & 0 & 0 & 0 & 0 & 0 \\ 0 & 0 & 25 & 0 & 50 & 50 & 0 & 90 & 90 & 90 & 90 & 90 & 90 & 0 & 75 & 0 & 75 & 0 \\ 10 & 0 & 0 & 0 & 0 & 0 & 0 & 90 & 90 & 90 & 90 & 90 & 90 & 0 & 0 & 0 & 0 & 0 \\ 0 & 0 & 25 & 0 & 50 & 50 & 0 & 90 & 90 & 90 & 90 & 90 & 90 & 0 & 0 & 0 & 0 & 0 \\ 10 & 0 & 0 & 0 & 0 & 0 & 0 & 90 & 90 & 90 & 90 & 90 & 90 & 0 & 0 & 0 & 0 & 0 \\ 0 & 0 & 25 & 0 & 50 & 50 & 0 & 90 & 90 & 90 & 90 & 90 & 90 & 0 & 0 & 0 & 0 & 0 \\ 10 & 0 & 0 & 0 & 0 & 0 & 0 & 90 & 90 & 90 & 90 & 90 & 90 & 0 & 0 & 0 & 0 & 0 \end{bmatrix}$$
Figure 4
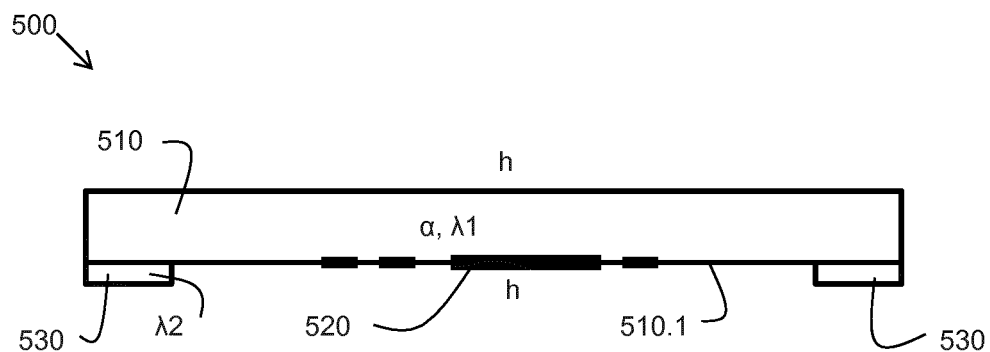
Figure 5A
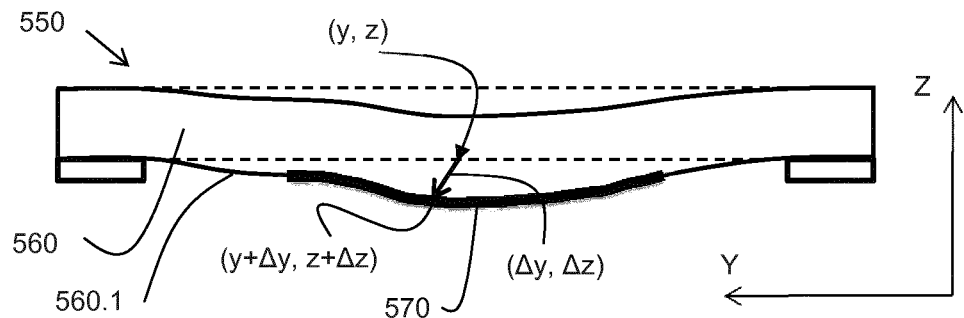
Figure 5B

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2017/051586, which was filed on Jan. 26, 2017, which claims the benefit of priority of U.S. provisional application No. 62/310,516, which was filed on Mar. 18, 2016, and which is incorporated herein in its entirety by reference.

FIELD

The present description relates to a control system, a method of controlling a lithographic apparatus, a lithographic apparatus, a computer program product and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to ensure proper operation of the manufactured device, it is desirable that different patterns that are consecutively applied have an accurate match. In order to ensure such a match, care is taken that the substrate is properly positioned, both in the horizontal plane and in vertical direction, relative to the image plane of the pattern.

SUMMARY

A possible mismatch between an imaged pattern and previously applied pattern may be caused by, for example, a deformation of the pattern. Such a deformation may be caused, e.g., by mechanical stresses or by thermal effects such as a non-uniform temperature distribution. When known, these effects may at least partly be compensated, e.g. by adjusting the projection system of the lithographic apparatus. Means to assess such a deformation of the pattern over the complete imaged area are limited. For example, a temperature of a top surface of a patterning device can be determined, e.g. at various locations on the patterning device, by means of infrared (IR) temperature sensors, the temperature measurements subsequently being used to determine a deformation of the patterning device.

It is desirable, for example, to provide a more accurate assessment of a deformation of a pattern on a patterning device.

According to an embodiment, there is provided a lithographic apparatus comprising:
an illumination system configured to condition a radiation beam;
a support constructed to support a patterning device comprising a pattern, the patterning device capable of imparting the radiation beam with the pattern in its cross-section to form a patterned radiation beam;
a substrate table constructed to hold a substrate;
a projection system configured to project the patterned radiation beam onto a target portion of the substrate; and
a control system configured to:
receive pattern data characterizing a distribution of the pattern on the patterning device,
receive radiation data characterizing the radiation beam,
determine a dissipation distribution of the pattern based on the pattern data and the radiation data,
determine a deformation of the pattern by applying the dissipation distribution in a thermo-mechanical model of the patterning device,
determine a control signal to control a component of the lithographic apparatus based on the deformation of the pattern, and
determine a density distribution of the pattern based on the pattern layout data and determine the dissipation distribution of the pattern based on the density distribution of the pattern and the radiation data.

According to an embodiment, there is provided control system for a lithographic apparatus, the control system configured to:
receive pattern data characterizing a distribution of a pattern on a patterning device for use in the lithographic apparatus, the pattern data comprising pattern layout data;
receive radiation data characterizing a radiation beam to be applied by the lithographic apparatus;
determine a dissipation distribution of the pattern based on the received pattern data and the received radiation data;
determine a deformation of the pattern by applying the dissipation distribution in a thermo-mechanical model of the patterning device;
determine a control signal to control a component of the lithographic apparatus based on the deformation of the pattern; and
determine a density distribution of the pattern based on the pattern layout data and determine the dissipation distribution of the pattern based on the density distribution of the pattern and the radiation data.

In an embodiment, there is provided a method of controlling a lithographic apparatus, the method comprising:
receiving pattern data characterizing a distribution of a pattern on a patterning device for use in the lithographic apparatus, the pattern data comprising pattern layout data;
receiving radiation data characterizing a radiation beam to be applied by the lithographic apparatus;
determining a dissipation distribution of the pattern based on the received pattern data and the received radiation data;
determining a deformation of the pattern by applying the dissipation distribution in a thermo-mechanical model of the patterning device;
determining a control signal for controlling a component of the lithographic apparatus based on the deformation of the pattern; and determining a density distribution of the pattern based on the pattern layout data and determine the dissipation distribution of the pattern based on the density distribution of the pattern and the radiation data.

In an embodiment, there is provided a computer program product comprising a set of computer readable instructions stored on a computer readable medium, the set of instructions configured to, when run on a computer, enable the computer to perform a method of:

receiving pattern data characterizing a distribution of a pattern on a patterning device for use in a lithographic apparatus, the pattern data comprising pattern layout data;

receiving radiation data characterizing a radiation beam to be applied by the lithographic apparatus;

determining a dissipation distribution of the pattern based on the received pattern data and the received radiation data;

determining a deformation of the pattern by applying the dissipation distribution in a thermo-mechanical model of the patterning device; and determining a control signal to control a component of the lithographic apparatus based on the deformation of the pattern determining a density distribution of the pattern based on the pattern layout data and determine the dissipation distribution of the pattern based on the density distribution of the pattern and the radiation data.

Density distribution of the pattern may represent an amount of patterned area per unit area, as a function of position.

The radiation data may comprise radiation beam intensity, radiation beam power, radiation beam duty cycle, or any combination selected from the foregoing.

BRIEF DESCRIPTION OF THE DRAWINGS

Embodiments will now be described, by way of example only, with reference to the accompanying schematic drawings in which corresponding reference symbols indicate corresponding parts, and in which:

FIG. 4 depicts a matrix representing a density distribution of a pattern;

FIGS. 5A and 5B schematically depict a cross-sectional view of a thermo-mechanical model as can be applied in an embodiment and a deformation of a pattern as determined using the thermo-mechanical model;

DETAILED DESCRIPTION

Figure 1:
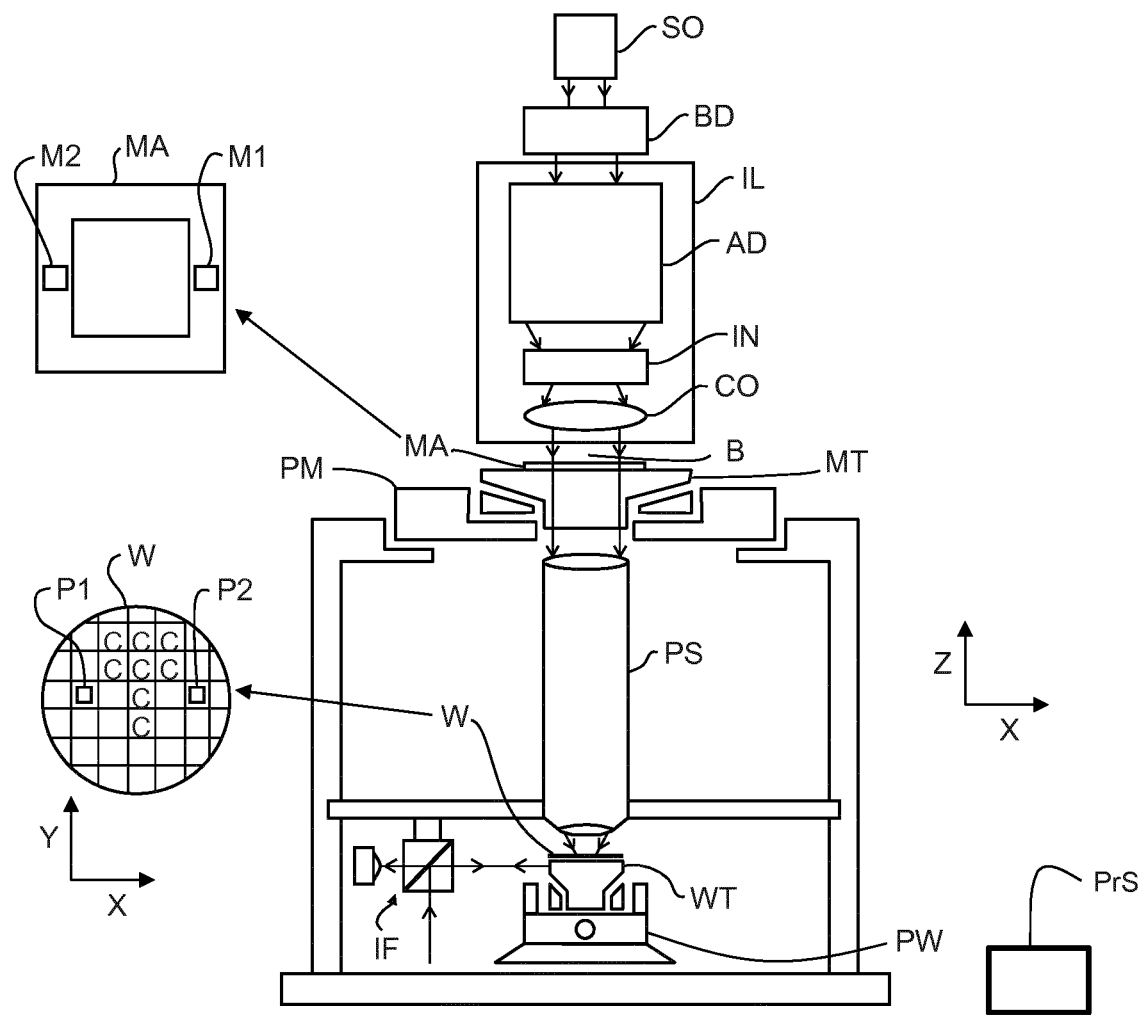
FIG. 1 schematically depicts a lithographic apparatus according to an embodiment.

FIG. 1 schematically depicts an embodiment of a lithographic apparatus. The apparatus includes an illumination system (illuminator) IL configured to condition a radiation beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more patterning device tables or "patterning device supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support structure (e.g., mask table) MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device table MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device table MT or "patterning device support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device table MT or "patterning device support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device table MT or "patterning device support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device table MT or "patterning device support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It is desirable, for example, to provide in a more accurate projection of a patterned beam of radiation onto a substrate by, at least party, taking a deformation of a pattern provided on or by a patterning device into account. In an embodiment, a deformation of the pattern of a patterning device due to dissipation is focused on.

Figure 2:
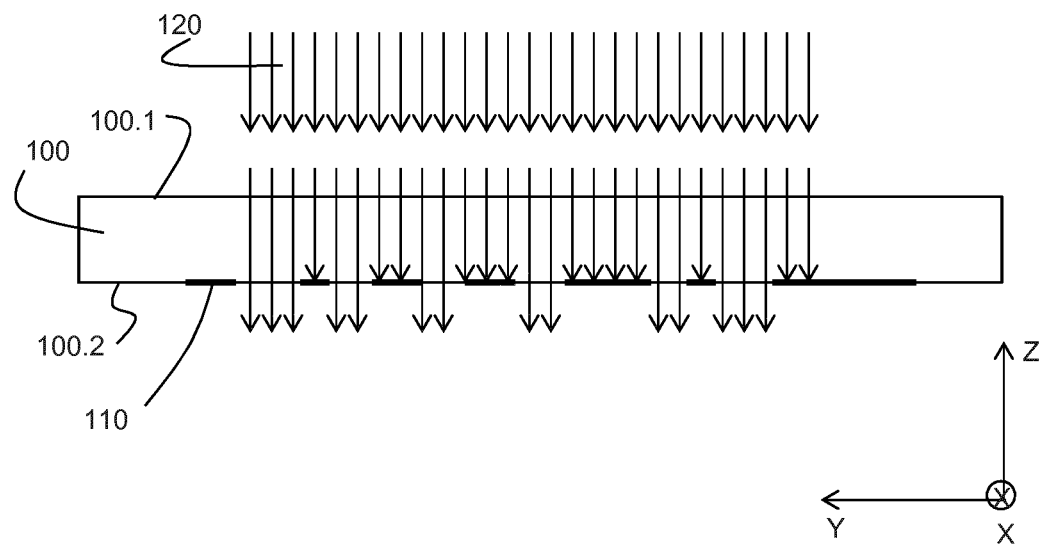
FIG. 2 schematically depicts a cross-sectional view of an embodiment of a patterning device as can be applied in a lithographic apparatus.

FIG. 2 schematically shows an embodiment of a cross-sectional view of a patterning device 100 as can be applied in a lithographic apparatus. The patterning device 100 as shown has a front, or upper, surface 100.1 and a back, or bottom, surface 100.2. On the back surface 100.2, a pattern 110 is provided. Typically, this is a two-dimensional pattern, extending in the XY-plane (the X-direction being perpendicular to the YZ-plane of the FIG. 2), that is to be projected accurately onto a substrate, e.g., to maintain a predetermined positional relationship with a pattern that is previously applied to the substrate. Such a patterning device 100 may e.g. be applied in a lithographic apparatus as shown in FIG. 1. During use, a conditioned beam of radiation 120, e.g. DUV radiation, may be projected onto the patterning device 100. The patterning device 100 is typically made of $SiO_2$ or fused silica, which is transparent to the DUV radiation beam 120. Typically, the pattern 110 as applied to the back surface 100.2 of the patterning device 100 may be a chromium layer. The patterned chromium layer is not transparent to the DUV radiation 120, rather the DUV radiation 120 is substantially absorbed or dissipated by the chromium layer. The dissipated radiation or dissipation will be converted to heat, increasing the temperature of the chromium layer, e.g. from an environmental temperature of 22° C. to 26° C. This elevated temperature of the chromium layer 110 may then heat the patterning device 100, by means of heat conduction. As a result of this heating, the patterning device 100, including the pattern 110, may deform. A deformation of the object may refer to a displacement of a point or location on the object relative to a nominal position. A point or location on the object may e.g. have a nominal position with coordinates (x,y,z) and, due the heating, displace to a position (x+Δx, y+Δy, z+Δz). As such, the deformation of the object at position (x,y,z) may be characterized by a displacement vector (Δx, Δy, Δz). Due to the heating of the patterning device 100, which may typically be non-uniform, various types of deformations may occur. As a first example of such deformations, there may be in-plane deformations of the pattern 110. In-plane deformations are deformations observable in the XY-plane, i.e. essentially parallel to the plane of the pattern 110. Such an in-plane deformation may thus be characterized by considering the X- and Y-components of the displacement vector (Δx, Δy, Δz) of different positions of the pattern 110.

In general, when an object is heated, out-of-plane deformations may additionally or alternatively occur. Such out-of-plane deformations may, e.g., be characterized by considering the Z-component of the displacement vector (Δx, Δy, Δz).

As explained above, the heating of the patterning device can, to a large extent, be attributed to the dissipation of the radiation beam in the pattern 110, which is, for the patterning device 100 as shown, located on the back surface 100.2 of the patterning device 100. Because the pattern 110, as a kind of heat source, is thus located on an outer surface 100.2 of the patterning device 100, the temperature distribution may have non-uniformity in the Z-direction, i.e. the temperature on the front surface 100.1 may differ from the temperature at the back surface 100.2. Due to this non-uniformity, the patterning device 100 may, e.g., bend. Such a bending of the patterning device, in particular of the pattern, may be characterized as an out-of-plane deformation of the pattern.

As will be clear from the above, the pattern thus acts, during operation, as a non-uniformly distributed heat source which causes the patterning device, in particular the pattern on the patterning device, to deform.

In an embodiment, a lithographic apparatus, such as as schematically shown in FIG. 1, is configured to determine a deformation of a pattern of a patterning device due to such a non-uniformly distributed heat source. In an embodiment as shown in FIG. 1, the lithographic apparatus comprises a control system PrS, the control system PrS configured to determine the deformation of the pattern by:

receiving pattern data characterizing a distribution of the pattern of the patterning device;

receiving radiation data characterizing the radiation beam;

determining a dissipation distribution of the pattern based on the pattern data and the radiation data; and determining a deformation of the pattern by applying the dissipation distribution in a thermo-mechanical model of the patterning device.

These steps will be explained in more detail below.

In accordance with an embodiment, the control system is further configured to determine a control signal to control a component of the lithographic apparatus based on the deformation of the pattern. As such, the deformation of the pattern as determined may be applied in the lithographic apparatus to adjust or control the operation of the apparatus, in order to mitigate or at least partly compensate any adverse effect of the deformation of the pattern.

A control system may include one or more processing units such as microprocessors or computers or the like. Typically, such a control system may include one or more input terminals to receive data to be processed and one or more output terminals to output processing results. A general structure of a control system as can be applied in an embodiment is discussed in more detail below.

In order to determine the deformation of the pattern, the control system as applied in an embodiment makes use of pattern data characterizing a distribution of the pattern of the patterning device as applied in the lithographic apparatus, and of radiation data characterizing the radiation beam as applied by the lithographic apparatus.

In an embodiment, pattern data characterizing a distribution of the pattern of the patterning device refers to information which can be used to assess the density of the pattern at a particular location, i.e., the amount of area that is covered by a pattern, per unit area, at the particular location. As such, in an embodiment, the pattern data may comprise a density distribution of the pattern. In such an embodiment, the pattern data may, e.g. provide, for each area of e.g. 2×2 $mm^2$ of the pattern, the percentage of patterned area, i.e. the percentage of area that is covered by the pattern, e.g. a chromium layer. In such an embodiment, the density distribution of the pattern may be represented by a two-dimensional table including the percentage of patterned area for each area.

Figure 3:
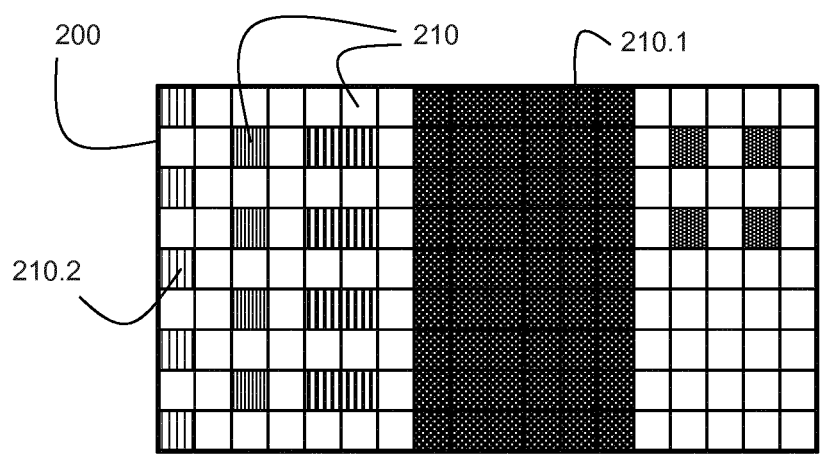
FIG. 3 schematically depicts density distribution of a pattern on a patterning device.

FIG. 3 schematically shows a representation of such a density distribution. In FIG. 3, a contour 200 of a pattern is schematically shown, the area within the contour being subdivided into sub-areas 210 of e.g. 2×2 $mm^2$. In the embodiment shown, the pattern is thus subdivided into a grid of 9×18 subareas of 2×2 $mm^2$. When the actual pattern is known, the percentage of patterned area can be determined in each subarea. In FIG. 3, this percentage is schematically indicated by the applied grating in the subareas, wherein a dense grating, as e.g. applied in subarea 210.1 is indicative of, e.g., a 90% patterned area, whereas a less dense grating, as e.g. applied in subarea 210.2 may be indicative of, e.g., a 10% patterned area. The density distribution as schematically shown in FIG. 3 may, e.g., be represented numerically by a matrix DD as shown in FIG. 4, each value in the 9×18 matrix indicating the percentage of patterned area in the corresponding subarea of the grid of 9×18 subareas shown in FIG. 3.

As will be clear to the skilled person, pattern data representing the actual pattern, i.e. the actual layout of the pattern, that is applied on a patterning device, may also be considered an example of pattern data that characterizes a distribution of the pattern on the patterning device in such a manner that it can be used to assess the density of the pattern at a particular location. When the actual layout of a pattern is known, this information can also be used to determine a density distribution of the pattern, for a desired resolution. As such, in an embodiment, the pattern data comprises pattern layout data and the control system is configured to determine a density distribution of the pattern based on the pattern layout data. In practice however, it may be difficult to obtain information about the actual layout of a pattern as applied on a patterning device, as this information may be kept secret by the developers of the pattern. In an embodiment, the actual layout of the pattern is not required. Rather, use is made of data from which a density distribution of the pattern can be derived or of data representing such a density distribution. It can be pointed out that the resolution applied to represent a density distribution of the pattern may be comparatively small, i.e. the size of the subareas applied in the grid that is used to subdivide the pattern may be comparatively large, compared to typical sizes of the structures of the actual pattern. Typically, subareas having a size ranging from 1-25 mm$^2$ may be applied to represent the density distribution of the pattern with a sufficient accuracy.

In an embodiment, the pattern data is used, together with radiation data characterizing the radiation beam applied in the lithographic apparatus, to determine the dissipation as occurring in the patterning device during operation, i.e. during projection of the patterned radiation beam onto a substrate. In particular, in accordance with an embodiment, the control system is further configured to convert the pattern data and the radiation data to a dissipation distribution of the pattern, i.e. a distribution of the dissipation occurring in the pattern. In an embodiment, pattern dissipation refers to the amount of energy absorbed by the pattern, e.g. energy of the radiation beam, the energy causing the pattern and the patterning device to heat up. In an embodiment, the determination of the dissipation distribution of the pattern is based on operational data of the applied radiation beam as the radiation data. Such operational data may e.g. include an intensity or power of the radiation beam, an intensity or power distribution over time, a duty cycle of the radiation beam, etc.

Based on such operational radiation data, the control system may e.g. determine, for each of the subareas of the pattern as shown in FIG. 3, the dissipation as occurring during operation. In an embodiment, the dissipation distribution of the pattern indicates, for each of the subareas as applied in the density distribution of the pattern, an average dissipation, average dissipation referring to the occurring dissipation averaged over a period of time. Alternatively, the dissipation distribution of the pattern may describe the dissipation occurring in each of the subareas as a function of time. Typically, the dissipation distribution as determined will have a similar distribution as the density distribution of the pattern.

During operation of the lithographic apparatus, a conditioned radiation beam, e.g. provided by the illumination system IL as shown in FIG. 1, is thus projected onto the patterning device providing the pattern, causing a dissipation in the patterning device. Because, in general, the pattern as applied on a patterning device may have a non-uniform density, the distribution of the dissipation of the pattern, also referred to as the dissipation distribution of the pattern, will have the same non-uniformity. Further, as the pattern is typically applied on an outer surface of the patterning device, the dissipation does not occur at a central position of the patterning device, but at an outer surface of the patterning device, as can be seen in FIG. 2. In accordance with an embodiment, this non-uniformly distributed heat source is thus modeled by the dissipation distribution of the pattern.

Using the dissipation distribution as determined, the control system PrS of the lithographic apparatus may determine a deformation of the pattern, by means of a thermo-mechanical model of the patterning device.

In an embodiment, a three-dimensional finite element model is used to determine a deformation of the pattern of the patterning device. In such an embodiment, a set of partial differential equations is solved taking into account boundary conditions that are applied to the model. Thermal boundary conditions which may be applied on different portions of the model may include expressing a given temperature, a given heat flux, and/or a convection condition with the environment. In such a model, one or more material characteristics such as density, specific heat and/or thermal conductivity may be implemented. These characteristics may in general depend on the temperature. The set of partial differential equations may be solved taking the boundary conditions and material characteristics into account, software to solve such a set of equations may be referred as a thermal solver, resulting in temperature distribution over the modeled object. In a next step, the elastic deformation of the object due to the temperature distribution may be determined, e.g. by solving a set of differential equations using a structural solver, i.e. software configured to solve a set of partial differential equations describing a thermo-elastic behavior of an object. It may be pointed out that thermal and structural solvers for respectively determining a temperature distribution of an object, e.g. based on a given heat load on the object, and for determining the occurring stresses or strain in the object, which may result in a deformation of the object, are known. It may further be noted that a structural or thermal solver need not be based on partial differential equations but may also be based on linear equations, e.g. describing Hooke's law.

FIG. 5A schematically shows a cross-sectional view of a thermo-mechanical model 500 (e.g. a three-dimensional finite element model) as can be applied in an embodiment to determine a deformation of a pattern. The model 500 comprises a finite element model of a patterning device 510, the patterning device 510 being modeled as a material having particular characteristics such as thermal expansion coefficient α, and thermal conductivity λ1. The model further includes heat sources 520 representing the dissipation occurring in a pattern on the patterning device 510, the heat sources being modelled as being distributed over the bottom surface 510.1, e.g. in accordance with the dissipation distribution as determined based on the pattern data and the radiation data, as discussed above. In the model 500, a heat transfer coefficient h is used to model the heat flux from the patterning device 510 towards the environment, e.g. the surrounding gas. In the embodiment as shown, the patterning device 510 is assumed to be mounted to a pair of clamps, e.g. vacuum clamps 530, configured to hold the patterning device during operation. Such clamps may be modelled with a thermal conductivity λ2. Using the model 500, including the dissipation distribution as heat sources 520, a deformation of the patterning device caused by thermal expansion may be determined. FIG. 5B schematically shows a possible (exaggerated) deformation 550 of the patterning device 560 as modelled using the model 510. Based on the deformation 550 of the patterning device 560, the deformation of the pattern 570 that is present on the outer surface 560.1 of the patterning device 560 can be determined. In an embodiment, such a deformation can be characterized by considering, for a plurality of positions (x,y,z) on the pattern, a displacement vector (Δx, Δy, Δz) describing the difference between the actual position (x+Δx, y+Δy, z+Δz) and the nominal position (x,y,z). Such a displacement vector (Δx, Δy, Δz) may e.g. be determined for a rectangular grid of positions on the pattern 570. Based on the displacement vector or the distribution over the pattern of the displacement vector, the deformation of the pattern can be analyzed or assessed and an appropriate action can be taken to account for the deformation.

In particular, in accordance with an embodiment, the control system PrS is further configured to determine a control signal for controlling a component of the lithographic apparatus based on the deformation of the pattern. Depending on the type or deformation that has been determined, different actions, specified by different control signals, may be applied.

As a first example, the deformation of the pattern 570 in the Z-direction may be used by the lithographic apparatus according to an embodiment to control the position of the patterning device 560 in the Z-direction, in order to keep the pattern in a desired focal plane of the apparatus.

As a second example, a deformation of the pattern in the XY-plane (the X-direction being perpendicular to the YZ-plane of FIG. 5) can be considered, e.g. based on the (Δx, Δy) components of the displacement vector. Such a deformation in the XY-plane may e.g. include one or more of the following:
a displacement of the pattern in the X- or Y-direction relative to the nominal position;
an enlargement of the pattern relative to its nominal size;
a position dependent displacement of features within the pattern on top of the enlargement of the pattern relative to its nominal size.

In the first case, the displacement relative to the nominal position may be corrected or at least partly compensated by controlling a position of the patterning device (e.g. patterning device MA as shown in FIG. 1) relative to the substrate W as shown in FIG. 1. In the second case, the magnification factor of the projection system (typically ¼ or ⅕) may be adjusted to take the enlargement into account. The third case may involve a combination of corrections for the first and second cases.

In an embodiment, the dissipation for the pattern can be described in terms of a temperature response by a set of mode shapes, e.g. thermal eigenmodes; the mode shapes being defined by amplitudes and corresponding time constants. In this embodiment, in a first step, an expected temperature response may be calculated, e.g. offline using a Finite Element Method, followed by a second step wherein the response is fitted by (3D) thermal modes each having a time constant and shape. This fit will result in modal amplitudes that can be applied to calculate the temperature profile over time.

In an embodiment, the control system PrS as applied in the lithographic apparatus is configured to determine the deformation of the pattern in real time. In such an embodiment, the dissipation distribution of the pattern, expressed as a function of time, may be used as input for a thermo-mechanical model that is configured to determine, based on the time dependent dissipation distribution, the occurring temperature distribution and thermal stresses occurring in the patterning device, as a function of time. In such an embodiment, the deformation of the pattern may be calculated as a function of time and applied to make the appropriate adjustment to one or more operational parameters of the lithographic apparatus. Examples of such operational parameters of the lithographic apparatus may e.g. include a position set point of the patterning device MA relative to the substrate W, a Z-position set point of the patterning device, and/or a set point of an optical component of the projection system PS, e.g. affecting a position of a focal plane of the apparatus or a magnification of the projection system PS. As the dissipation distribution as a function of time may be known beforehand, the pattern deformation may also be determined in advance, i.e. off-line. As such, in an embodiment, there is provided a control system for a lithographic apparatus, the control system being configured to:
receive pattern data characterizing a distribution of a pattern of a patterning device for use in the lithographic apparatus;
receive radiation data characterizing a radiation beam to be applied by the lithographic apparatus;
determine a dissipation distribution of the pattern based on the received pattern data and the received radiation data;
determine a deformation of the pattern by applying the dissipation distribution in a thermo-mechanical model of the patterning device; and
determine a control signal to control a component of the lithographic apparatus based on the deformation of the pattern.

In such an embodiment, the control system may e.g. be configured to determine an averaged (over time) deformation of the pattern based on an averaged dissipation occurring in the pattern. Alternatively, or in addition, the control system may be configured to determine the deformation of the pattern as a function of time, e.g. based on a dissipation distribution as a function of time. In such an embodiment, the control system may be configured to determine, for a given patterning device provided with a particular pattern, the deformation of the pattern and store it in a database. In an embodiment, the control system is configured to determine the deformation of the pattern for different operating conditions. These different operating conditions may e.g. include an applied radiation power or intensity of the radiation beam, e.g. the radiation beam 120 of FIG. 2. These different operating conditions may also be related to velocities or accelerations that are applied by a lithographic apparatus during an exposure process. The velocity or acceleration as applied to a patterning device during an exposure process may e.g. affect the heat transfer coefficient h as applied in the thermo-mechanical model.

Figure 6:
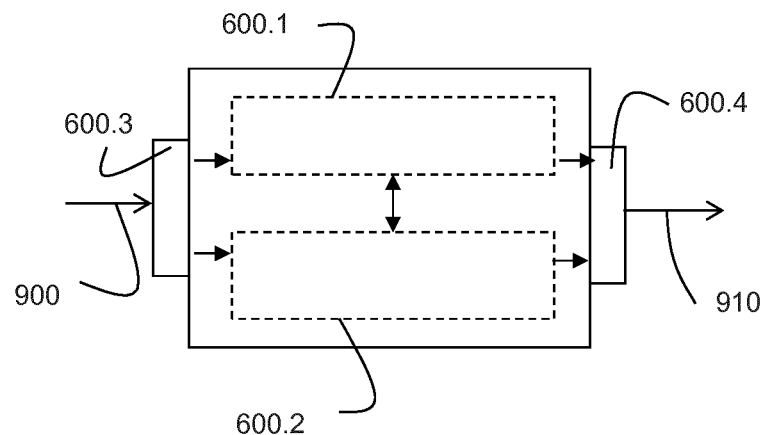
FIG. 6 schematically depicts a control system according to an embodiment.

FIG. 6 schematically shows an embodiment of a control system 600. Such a control system 600 may be applied as a stand-alone tool or may be incorporated in a lithographic apparatus.

The control system 600 as schematically shown in FIG. 6 comprises an input terminal 600.3 to receive input data 900 such as the pattern data or operating conditions or parameters as described above. The input data 900 as received may be provided to a processor 600.1 of the control system 600. Such a processor 600.1 may e.g. be a microprocessor, a computer or the like for processing data such as the input data 900 as received. In the embodiment as shown, the control system further comprises a memory 600.2 or memory unit to store data such as the received input data or to store computational results of the processing by the processor 600.1. As such, the memory 600.2 may e.g. serve as a database to store pattern deformations as determined by the processor 600.1, e.g. for various operating conditions. In the embodiment as shown, the control system 600 further comprises an output terminal 600.4 to output a signal 910 e.g. representing a pattern deformation.

In an embodiment, the control system 600, in particular the processor 600.1 of the control system 600, may be configured to determine an optical control signal to adjust a setting of an illumination system or a projection system of a lithographic apparatus based on the deformation of the pattern. Alternatively, or in addition, the control system 600 may be configured to determine a position control signal to control a position of a patterning device, e.g. held by a support in a lithographic apparatus, relative to a substrate, e.g. held by a substrate table in a lithographic apparatus. In such an embodiment, the output terminal 600.4 of the control system 600 is thus configured to readily output a control signal to control an operating of the lithographic apparatus. In such an embodiment, the control system 600 may e.g. be integrated in a control system of the lithographic apparatus.

As described above, use is made of a thermo-mechanical model to determine a deformation of a pattern on a patterning device; examples of such models may include finite element models, boundary element models, modal shapes, etc.

As will be understood by the skilled person, the accuracy or reliability of the outcome or results of such modeling may depend on the parameters used in the model. In particular, when referring to FIG. 5, the heat transfer coefficient h as applied in the model as depicted may determine the temperature distribution in the patterning device 510 and thus the corresponding deformation 550. In order to more accurately model the temperature distribution and corresponding deformation of a pattern on a patterning device, an embodiment of the control system makes use of measurement data, in particular of temperature measurements of the patterning device. In such an embodiment, the control system may thus be configured to receive measurement data representative of a temperature of the patterning device and apply the measurement data to at least partly characterize the thermo-mechanical model of the patterning device.

Figure 7:
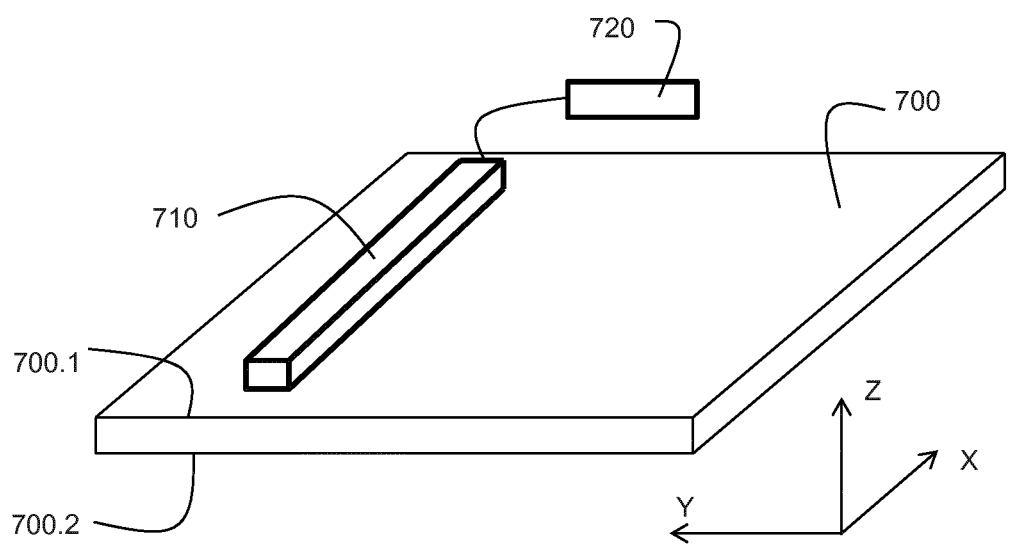
FIG. 7 schematically depicts an array of temperature sensors as can be applied in an embodiment.

In an embodiment, the lithographic apparatus comprises one or more temperature sensors to determine a temperature or temperature distribution of the patterning device. Such an arrangement of one or more temperature sensors is schematically shown in FIG. 7. FIG. 7 schematically shows a patterning device 700 having a front surface 700.1 and a back surface 700.2 and an array of infrared (IR) temperature sensors 710 arranged to assess a temperature of the patterning device 700 by measuring infrared radiation emanating from the patterning device 700. The radiation as measured by the array of temperature sensors 710 may e.g. be provided to a processing unit 720, to determine the temperature of the patterning device 700. By providing relative displacement between the patterning device 700 and the array of sensors 710 in the Y-direction, a two-dimensional temperature profile of the patterning device, i.e. a temperature profile in the XY-plane, may be established. This measured temperature profile may then be used, in an embodiment, to more accurately predict the deformation of the pattern of the patterning device. In such an embodiment, the thermo-mechanical model as applied may e.g. be adjusted by the following iterative process:

Step 1: initializing the thermo-mechanical model by selecting initial values for the model parameters.

Step 2: determine a temperature profile of a surface (e.g., the upper surface) of the patterning device by solving the thermo-mechanical model using the dissipation distribution as input.

Step 3: comparing the determined temperature profile with the measured temperature profile and adjust any model parameters of the model based on the comparison.

Step 4: repeat steps 2 and 3 until the determined temperature profile substantially corresponds to the measured temperature profile.

The temperature sensor arrangement as shown in FIG. 7 is configured to determine the temperature profile at the upper surface of the patterning device, whereas the temperature or temperature distribution at the bottom surface, the bottom surface being provided with the pattern, could be considered more relevant. It should however be pointed out that it may be difficult to measure the temperature profile on the bottom side for the following reasons:

a pellicle may be provided near the bottom surface of the patterning device to protect the pattern;

the pattern will typically have a different reflectivity than the bulk material of the patterning device, which may affect an IR temperature measurement performed at the bottom surface.

The combination of performing a temperature measurement at the front surface or upper surface of the patterning device, i.e. the surface that does not contain the pattern, and modeling the dissipation distribution occurring in the pattern thus circumvents the need to include more complex temperature measurements of the pattern itself. It should however be noted that, in an embodiment, the method of determining a deformation of a pattern on a patterning device can include other temperature measurements as well. Such temperature measurements may, e.g., include the use of temperature sensors mounted to the patterning device or, as, e.g., described in European patent application number 16159723.2, incorporated herein in its entirety by reference, may include determining an average temperature over the width of a patterning device at one or more locations using an interferometer arrangement. Using such an interferometer arrangement, a temperature profile of a patterning device may be determined, the temperature profile representing at the particular measurement locations on the patterning device, an average temperature over the width or thickness of the patterning device, rather than a temperature on an outer surface of the patterning device. Such measurements may, in an embodiment, be applied in a similar manner as described above to improve or adjust the parameters as applied in the thermo-mechanical model.

In an embodiment, alternative measurements to temperature measurements are additionally or alternatively applied to improve the accuracy of the assessment of the deformation of the pattern. In particular, the control system may further be configured to receive measurement data representative of a deformation of the patterning device and use this measurement data to set or adjust a parameter of the thermo-mechanical model.

In such an embodiment, the measurement data may, e.g., include thickness measurements performed on the patterning device, e.g. at a plurality of locations. Such thickness measurements may be obtained, e.g., using an interferometer arrangement as described in European patent application number 16159723.2, incorporated herein in its entirety by reference.

The various embodiments as described enable determination of a deformation of a pattern on a patterning device cause by a heating of the pattern during operation. Such a deformation may be described as a steady-state deformation, e.g. based on an average dissipation occurring in the pattern, or may be described as a transient, time-dependent deformation, taking the actual time-dependent dissipation in the pattern into account. When a deformation of a pattern occurs and no measures are taken, the projection of the pattern onto the substrate, i.e. on the target portions such as target portions C shown in FIG. 1, may be inaccurate. In particular, in-plane deformations of the pattern may, e.g., cause an alignment error between the projected pattern and a previously applied pattern on the substrate, whereas out-of-plane deformations may, e.g., cause the image of the pattern to be out of focus, i.e. somewhat blurred, during exposure.

In case a deformation of a pattern occurs and is determined, i.e. quantified to some degree, measures may be taken to improve the exposure or projection of the pattern onto the substrate. Such measures may e.g. include adjusting a setting of the illumination system, e.g. illuminator IL as shown in FIG. 1, or the projection system, e.g. projection system PS as shown in FIG. 1, of the exposure apparatus. Alternatively, or in addition, a relative position of the patterning device and the substrate may be controlled based on the deformation of the pattern as determined. In particular, in an embodiment, the lithographic apparatus may comprise a positioning device, such as positioning device PW or PM or a combination thereof, controlling a position of the substrate table relative to the support based on the deformation of the pattern, e.g. based on an in-plane deformation of the pattern. In such an embodiment, the positioning device may e.g. be configured to control the position of the substrate table relative to the patterning device support by means of a set point. Such a set point may e.g. be provided to a control system of the positioning device, the set point being based on the deformation of the pattern.

Thus, an embodiment of the invention may, for example, enable providing an improved projection of a pattern of a patterning device onto a substrate. The improvement may result in an improved alignment to a previously projected patterned layer and/or in an improved focusing of the imaged pattern.

In an embodiment, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a control system configured to: receive pattern data characterizing a distribution of the pattern on the patterning device, the pattern data comprising pattern layout data, receive radiation data characterizing the radiation beam, determine a dissipation distribution of the pattern based on the pattern data and the radiation data, determine a deformation of the pattern by applying the dissipation distribution in a thermo-mechanical model of the patterning device, and determine a control signal to control a component of the lithographic apparatus based on the deformation of the pattern, and the control system is configured to determine a density distribution of the pattern based on the pattern layout data and determine the dissipation distribution of the pattern based on the density distribution of the pattern and the radiation data.

In an embodiment, the pattern data comprises a density distribution of the pattern, and the control system is configured to determine the dissipation distribution of the pattern based on the density distribution of the pattern and the radiation data. In an embodiment, the control system is configured to determine an optical control signal, as the control signal, to adjust a setting of the illumination system or the projection system, based on the deformation of the pattern. In an embodiment, the control system is configured to determine a position control signal, as the control signal, to control a position of the substrate table relative to the support, based on the deformation of the pattern. In an embodiment, the apparatus further comprises an image sensor configured to capture an image of the pattern and wherein the control system is configured to receive the image as the pattern data. In an embodiment, the thermo-mechanical model comprises a three-dimensional finite element model of the patterning device. In an embodiment, the radiation data comprises radiation beam intensity, radiation beam power, radiation beam duty cycle, or any combination selected from the foregoing. In an embodiment, the control system is further configured to receive measurement data representative of a temperature of the patterning device and to set a parameter of the thermo-mechanical model of the patterning device based on the measurement data. In an embodiment, the apparatus further comprises a temperature sensor configured to provide the measurement data. In an embodiment, the temperature sensor comprises an array of infrared temperature sensors, configured to measure a temperature of a surface of the patterning device and provide the measurements of the temperature of the surface to the control system as the measurement data. In an embodiment, the array of infrared temperature sensors is configured to measure a temperature of a front surface of the patterning device, the pattern being provided on a back surface of the patterning device opposing the front surface.

In an embodiment, there is provided a method of controlling a lithographic apparatus, the method comprising: receiving pattern data characterizing a distribution of a pattern on a patterning device for use in the lithographic apparatus, the pattern data comprising pattern layout data; receiving radiation data characterizing a radiation beam to be applied by the lithographic apparatus; determining a dissipation distribution of the pattern based on the received pattern data and the received radiation data; determining a deformation of the pattern by applying the dissipation distribution in a thermo-mechanical model of the patterning device; determining a control signal to control a component of the lithographic apparatus based on the deformation of the pattern; and determining a density distribution of the pattern based on the pattern layout data and determine the dissipation distribution of the pattern based on the density distribution of the pattern and the radiation data.

In an embodiment, there is provided a control system for a lithographic apparatus, the control system configured to: receive pattern data characterizing a distribution of a pattern on a patterning device for use in the lithographic apparatus, the pattern data being pattern layout data; receive radiation data characterizing a radiation beam to be applied by the lithographic apparatus; determine a dissipation distribution of the pattern based on the received pattern data and the received radiation data; determine a deformation of the pattern by applying the dissipation distribution in a thermo-mechanical model of the patterning device; determine a control signal to control a component of the lithographic apparatus based on the deformation of the pattern; and determining a density distribution of the pattern based on the pattern layout data and determine the dissipation distribution of the pattern based on the density distribution of the pattern and the radiation data.

In an embodiment, there is provided a computer program product comprising a set of computer readable instructions stored on a computer readable medium, the set of instructions configured to, when run on a computer, enable the computer to perform a method of: receiving pattern data characterizing a distribution of a pattern on a patterning device for use in a lithographic apparatus, the pattern data being pattern layout data; receiving radiation data characterizing a radiation beam to be applied by the lithographic apparatus; determining a dissipation distribution of the pattern based on the received pattern data and the received radiation data; determining a deformation of the pattern by applying the dissipation distribution in a thermo-mechanical model of the patterning device; determining a control signal to control a component of the lithographic apparatus based on the deformation of the pattern; and determining a density distribution of the pattern based on the pattern layout data and determine the dissipation distribution of the pattern based on the density distribution of the pattern and the radiation data.

In an embodiment, there is provided a device manufacturing method comprising projecting, using a lithographic apparatus, a patterned beam of radiation onto a substrate, wherein projecting the patterned beam of radiation is preceded by controlling the apparatus in accordance with a method described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate; and
    a control system configured to at least:
        obtain a density distribution of the pattern,
        receive radiation data characterizing the radiation beam,
        receive measurement data representative of a temperature of the patterning device and set a parameter of a thermo-mechanical model of the patterning device based on the measurement data, the thermo-mechanical model further comprising one or more variables in addition to the parameter and the thermo-mechanical model comprising a three-dimensional finite element model of the patterning device,
        determine a spatial distribution of dissipation of the pattern based on the radiation data and the density distribution of the pattern,
        determine a deformation of the pattern by applying the dissipation distribution in the thermo-mechanical model of the patterning device, and
        determine a control signal to control a component of the lithographic apparatus based on the deformation of the pattern.

2. The apparatus of claim 1, wherein the control system is configured to determine an optical control signal, as the control signal, to adjust a setting of the illumination system or the projection system, based on the deformation of the pattern.

3. The apparatus of claim 1, wherein the control system is configured to determine a position control signal, as the control signal, to control a position of the substrate table relative to the support, based on the deformation of the pattern.

4. The apparatus of claim 1, further comprising an image sensor configured to capture an image of the pattern and wherein the control system is configured to receive the image as pattern data and determine the density distribution of the pattern based on the pattern data.

5. The apparatus of claim 1, wherein the radiation data comprises radiation beam intensity, radiation beam power, radiation beam duty cycle, or any combination selected from the foregoing.

6. The apparatus of claim 1, further comprising a temperature sensor configured to provide the measurement data.

7. The apparatus of claim 6, wherein the temperature sensor comprises an array of infrared temperature sensors, configured to measure a temperature of a surface of the patterning device and provide the measurements of the temperature of the surface to the control system as the measurement data.

8. The apparatus of claim 7, wherein the array of infrared temperature sensors is configured to measure a temperature of a front surface of the patterning device, the pattern being provided on a back surface of the patterning device opposing the front surface.

9. A method of controlling a lithographic apparatus, the method comprising:
obtaining a density distribution of a pattern on a patterning device for use in the lithographic apparatus;
receiving radiation data characterizing a radiation beam to be applied by the lithographic apparatus;
receiving measurement data representative of a temperature of the patterning device and setting a parameter of a thermo-mechanical model of the patterning device based on the measurement data, the thermo-mechanical model further comprising one or more variables in addition to the parameter and wherein the thermo-mechanical model comprises a three-dimensional finite element model of the patterning device;
determining a spatial distribution of dissipation of the pattern based on the density distribution of the pattern and the received radiation data;
determining a deformation of the pattern by applying the dissipation distribution in the thermo-mechanical model of the patterning device; and
determining a control signal to control a component of the lithographic apparatus based on the deformation of the pattern.

10. A device manufacturing method comprising projecting, using a lithographic apparatus, a patterned beam of radiation onto a substrate, wherein projecting the patterned beam of radiation is preceded by controlling the apparatus in accordance with claim 9.

11. A computer program product comprising a set of computer readable instructions stored on a non-transitory computer readable medium, the set of instructions configured to, when run on a computer system, enable the computer system to at least:
obtain a density distribution of the pattern of a pattern on a patterning device for use in a lithographic apparatus;
receive radiation data characterizing a radiation beam to be applied by the lithographic apparatus;
receive measurement data representative of a temperature of the patterning device and set a parameter of a thermo-mechanical model of the patterning device based on the measurement data, the thermo-mechanical model further comprising one or more variables in addition to the parameter and the thermo-mechanical model comprising a three-dimensional finite element model of the patterning device;
determine a spatial distribution of dissipation of the pattern based on the density distribution of the pattern and the received radiation data;
determine a deformation of the pattern by applying the dissipation distribution in the thermo-mechanical model of the patterning device; and
determine a control signal to control a component of the lithographic apparatus based on the deformation of the pattern.

12. The computer program product of claim 11, wherein the instructions are configured to determine an optical control signal, as the control signal, to adjust a setting of an illumination system of the lithographic apparatus or of a projection system of the lithographic apparatus, based on the deformation of the pattern.

13. The computer program product of claim 11, wherein the instructions are configured to determine a position control signal, as the control signal, to control a position of a substrate table of the lithographic apparatus, based on the deformation of the pattern.

14. The computer program product of claim 11, wherein the radiation data comprises radiation beam intensity, radiation beam power, radiation beam duty cycle, or any combination selected from the foregoing.

15. A computer program product comprising a set of computer readable instructions stored on a non-transitory computer readable medium, the set of instructions configured to, when run on a computer system, enable the computer system to at least:
obtain a density distribution of a pattern on a patterning device for use in a lithographic apparatus;
receive radiation data characterizing a radiation beam to be applied by the lithographic apparatus;
determine a spatial distribution of dissipation of the pattern based on the density distribution of the pattern and the received radiation data;
determine a deformation of the pattern by applying the dissipation distribution as in a thermo-mechanical model of the patterning device, wherein the thermo-mechanical model is configured to determine deformation in each of at least three orthogonal dimensions; and
determine a control signal to control a component of the lithographic apparatus based on the deformation of the pattern.

16. The computer program product of claim 15, wherein the instructions are further configured to cause the computer system to:
receive measurement data representative of a temperature of the patterning device, and
set a parameter of a thermo-mechanical model of the patterning device based on the measurement data.

17. The computer program product of claim 15, wherein the instructions are configured to determine a position control signal, as the control signal, to control a position of a table of the lithographic apparatus, based on the deformation of the pattern.

* * * * *